(12) United States Patent
Nakamura

(10) Patent No.: US 6,472,761 B2
(45) Date of Patent: Oct. 29, 2002

(54) SOLID-STATE IMAGE PICKUP APPARATUS AND MANUFACTURING METHOD THEREOF

(75) Inventor: Masao Nakamura, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 5 days.

(21) Appl. No.: 09/767,214

(22) Filed: Jan. 22, 2001

(65) Prior Publication Data

US 2001/0022401 A1 Sep. 20, 2001

(30) Foreign Application Priority Data

Mar. 15, 2000 (JP) ........................................ 2000-072681

(51) Int. Cl.⁷ .................... H01L 31/0203; H01L 23/48; H01L 23/495
(52) U.S. Cl. ...................... 257/778; 257/738; 257/668; 257/433
(58) Field of Search ................................ 257/433, 778, 257/738, 668

(56) References Cited

U.S. PATENT DOCUMENTS 5,046,161 A * 9/1991 Takada ......................... 357/69
5,408,121 A * 4/1995 Nakamura et al. ........... 257/433
5,952,714 A * 9/1999 Sano et al. ................... 257/680

FOREIGN PATENT DOCUMENTS

| JP | 293263 | * 10/1992 |
| JP | 06-204442 | 7/1994 |

OTHER PUBLICATIONS

U.S. application Ser. No. 09/757,719 Nakamura, filed Jan. 10, 2001.

* cited by examiner

*Primary Examiner*—Eddie Lee
*Assistant Examiner*—Joseph Nguyen
(74) *Attorney, Agent, or Firm*—Dike, Bronstein, Roberts & Cushman IP Group, Edwards & Angell, LLP; David G. Conlin; George W. Hartnell, III

(57) ABSTRACT

An object of the present invention is to provide a solid-state image pickup apparatus capable of reducing man-hours for bonding, improving bonding quality, and being readily integrated into peripheral devices, and a manufacturing method thereof. The solid-state image pickup apparatus of the present invention includes a transparent substrate having a projecting electrode connection electrode terminal, and a solid-state image pickup device in which each first projecting electrode corresponding to the projecting electrode connection electrode terminal is formed on each electric signal I/O terminal, the transparent substrate and the solid-state image pickup device being bonded by face-down packaging. The projecting electrode connection electrode terminal and each first projecting electrode are connected by ultrasonic bonding. On electrode terminals of the transparent substrate are respectively formed second projecting electrodes. On the transparent substrate, a print board having a frame aperture being as large as the solid-state image pickup device and a non-pin type lead terminal structure is joined by electrically connecting second projecting electrodes and by hermetically sealing a light receiving surface of the solid-state image pickup device with a thermosetting resin.

9 Claims, 11 Drawing Sheets

F I G. 10 (a)
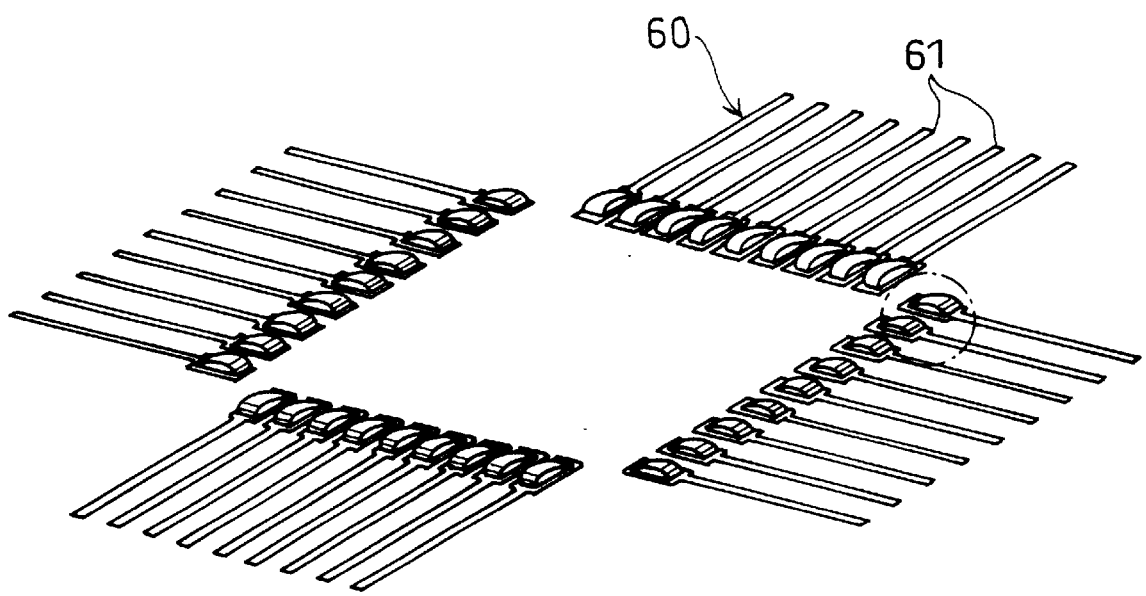
F I G. 10 (b)
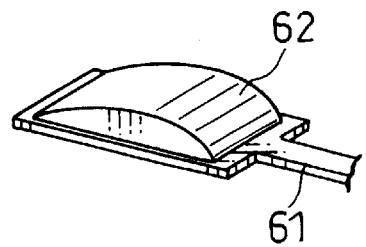

SOLID-STATE IMAGE PICKUP APPARATUS AND MANUFACTURING METHOD THEREOF

FIELD OF THE INVENTION

The present invention relates to a solid-state image pickup apparatus which adopts a face-down packaging (face-down bonding) so as to mount a solid-state image pickup device, and to a manufacturing method thereof.

BACKGROUND OF THE INVENTION

Conventionally, as shown in FIG. 13, a solid-state image pickup apparatus 100 has a structure in which a solid-state image pickup device 102 is fixed to a package 101, and the solid-state image pickup device 102 and the package 101 are connected by wiring, using Au wires 103, and a light receiving portion of the solid-state image pickup device 102 is sealed with a transparent substrate 104 of glass, optical filter and the like. This structure is generally called a "wire bonding structure".

However, in order to prevent a short-circuit defect on the Au wires 103 for connecting an electrode terminal 105 of the package 101 with an electrode terminal 106 of the solid-state image pickup device 102, it is required that the solid-state image pickup apparatus 100 of the wire bonding structure provides a wire loop so that it has a space in a direction of height, and the adjacent electrode terminals 105 of the package 101 have a wide pitch therebetween, thus being difficult to attain a compact and thin solid-state image pickup apparatus. Since there is a limit in attaining a compact and thin solid-state image pickup apparatus by the solid-state image pickup apparatus 100 having the foregoing structure, a solid-state image pickup apparatus disclosed, for example, in Japanese Unexamined Patent Publication No. 204442/1994 (Tokukaihei 6-204442 published on Jul. 22, 1994) adopts the following structure. That is, as shown in FIG. 14, a solid-state image pickup apparatus 110 adopts face-down packaging for mounting a solid-state image pickup device 112 by making a surface thereof face a surface of a transparent substrate 111 so as to directly equip the transparent substrate 111 with the solid-state image pickup device 112, thereby attempting to realize a compact and thin solid-state image pickup apparatus.

Thus, the conventional solid-state image pickup apparatus 110 including the solid-state image pickup device 112 on the transparent substrate 111 by direct face-down packaging has a great advantage in realizing a compact and thin solid-state image pickup apparatus. However, electric signal external input/output (I/O) terminals 113 on the transparent substrate 111 are disposed to point a side of light receiving surface of the solid-state image pickup device 112, and therefore, the conventional solid-state image pickup apparatus 110 has such a problem that a highly developed assembly technique is required so as to integrate the solid-state image pickup apparatus 110 into peripheral devices.

Namely, the solid-state image pickup apparatus 110, though miniaturized and thin, is so small that its workability is poor. Therefore, it is necessary to utilize a large-scale apparatus so as to allow thus small mounting component to be recognized as an equipment, and determine a mounting position, etc. This, as a result, raises such problems as to require higher development or complication of, and an increase in the cost of, an apparatus for mounting. More specifically, under such circumstances as above, in order to assemble components into an apparatus, it is necessary either to increase the manpower or to automate the assembly.

However, in fact, increasing the manpower is difficult, and the automation of the assembly requires large-scale devices such as a position recognizing device. That is, adopting either of the above means results in a problem of a large increase in costs.

Meanwhile, generally, a solid-state image pickup device is different from a normal semiconductor device in terms of dealing with an optical signal, i.e., an image. Moreover, on a surface of the solid-state image pickup device is formed organic components such as a color filter and a micro lens. Consequently, it is preferable that the surface of the solid-state image pickup device be hermetically sealed so as to prevent dusts, etc. In addition, most careful attention should be paid in the manufacturing steps of bonding and mounting assembly.

Therefore, during these manufacturing steps, it is required to prevent dusts and blemishes, and a bump or resin from being pressed out to a light receiving portion.

In this respect, the conventional solid-state image pickup apparatus 110 shown in FIG. 14 has the following problems with regard to the bonding of projecting electrodes 114, resin setting at the time of face-down packaging of the solid-state image pickup device 112, dust disposing process at the time of face-down packaging.

First, when bonding the projecting electrodes 114, as shown in FIG. 14, at the time of the face-down packaging of the solid-state image pickup device 112, a conductive adhesive 116 is used to join the projecting electrodes 114 of the solid-state image pickup device 112 to an inner wiring metal layer 115 of the transparent substrate 111. In that case, the conductive adhesive 116 is applied in a state of dots to the projecting electrodes 114. This raises a problem of complication of the manufacturing step of bonding the projecting electrodes 114.

Meanwhile, as to the setting of resin at the time of face-down packaging of the solid-state image pickup device 112, projecting frame resins 118 which are different from seal resin 117 are arranged to remain inside of the projecting electrodes 114 without being set. When the seal resin 117 is applied for sealing in the following step, the projecting frame resins 118 play a role as a stopper which prevents the seal resin 117 from being pressed out. Further, in the solid-state image pickup apparatus 110, the conductive adhesive 116 and the projecting frame resins 118 are set by an application of heat simultaneously with the setting of the seal resin 117. For this reason, there arises problems such as the complication of, and an increase in, manufacturing processes at the time of face-down packaging.

Next, as to a problem of dusts at the time of face-down packaging, in the solid-state image pickup apparatus 110, a surface of the solid-state image pickup device 112 is hermetically sealed simultaneously with the face-down packaging.

Accordingly, in addition to a problem of a high probability of adhesion of dusts due to many steps of applying a resin, the adhered dusts cannot easily be removed. Further, since the resins are not yet set, there is such a problem that they are pressed out with respect to the inside of the light receiving surface.

SUMMARY OF THE INVENTION

It is an object of the present invention to provide a solid-state image pickup apparatus capable of reducing man-hours in bonding, improving bonding quality, and being readily integrated into peripheral devices, and a manufacturing method of the solid-state image pickup apparatus.

In order to attain the foregoing object, the solid-state image pickup apparatus according to the present invention includes: a transparent substrate having an inner wiring metal layer and an electrode terminal group for outputting an electric signal to the outside; a solid-state image pickup device in which each first projecting electrode corresponding to the inner wiring metal layer of the transparent substrate is formed on each surface electrode; and a print board of non-pin type lead terminal structure including an aperture which is as large as the solid-state image pickup device, wherein: the transparent substrate includes second projecting electrodes which are respectively formed on electrode terminals of the electrode terminal group, the transparent substrate and the solid-state image pickup device are bonded by face-down packaging, and the inner wiring metal layer of the transparent substrate and the each first projecting electrode of the solid-state image pickup device are connected by ultrasonic bonding, and the transparent substrate and the print board are electrically connected at the each second projecting electrode of the transparent substrate, and joined so that a light receiving portion of the solid-state image pickup device is hermetically sealed with a thermosetting resin.

With the foregoing invention, the transparent substrate having the inner wiring metal layer and the electrode terminal group for outputting an electric signal to the outside, and the solid-state image pickup device in which each the first projecting electrode corresponding to the inner wiring metal layer of the transparent substrate is formed on each surface electrode, are bonded by face-down packaging. Therefore, a compact and thin solid-state image pickup apparatus, the size of which is closer to outer dimensions of the solid-state image pickup device than the size of a solid-state image pickup apparatus adopting wire-bonding, can be realized. Note that, the inner wiring metal layer may be formed of, for example, an insulating thin film and a conductive thin film, which are stacked.

Here, in the present invention, the inner wiring metal layer of the transparent substrate are connected with each the first projecting electrode of the solid-state image pickup device by ultrasonic bonding.

That is, in the case of a conventional face-down packaging, the first projecting electrodes of the solid-state image pickup device and the inner wiring metal layers of the transparent substrate were electrically connected by dotting the first projecting electrodes with the conductive adhesive, thus resulting in problems such as a complication of manufacturing steps and an increase in man-hours.

However, in the present invention, ultrasonic bonding is adopted to connect the inner wiring metal layers of the transparent substrate and the first projecting electrodes of the solid-state image pickup device. The ultrasonic bonding is such a method as to apply pressure and ultrasound to joint portions among the inner wiring metal layers and the first projecting electrodes so as to perform solid-state welding, and thus simplifying and ensuring the joint.

Further, in the present invention, the second projecting electrodes are respectively formed on the electrode terminals of the electrode terminal group of the transparent substrate, and to the transparent substrate is joined a print board having a frame aperture which is as large as the solid-state image pickup device and a non-pin type lead terminal structure, by electrically connecting each second projecting electrode of the transparent substrate and by hermetically sealing a light receiving portion of the solid-state image pickup device with a thermosetting resin.

That is, conventionally, the solid-state image pickup device and the transparent substrate were simply bonded by the face-down packaging, and therefore, the electrode terminal group of the transparent substrate was pointed toward the side of the solid-state image pickup device, and furthermore, since this portion of the electrode terminal group is a small area, there was such a problem that connection for outputting an electric signal from the electrode terminal group to the outside was difficult.

However, in the present invention, the electrode terminal group of the transparent substrate is connected with the print board having the non-pin type lead terminal structure via the second projecting electrodes respectively formed in the electrode terminal group.

Accordingly, a signal to the outside can be outputted via the non-pin type lead terminals which are formed on the print board, and as a result, the signal can be outputted in a separate place from the solid-state image pickup device.

As a result, the output from the transparent substrate, i.e., the output from the solid-state image pickup device can readily be obtained, and therefore, when the present solid-state image pickup apparatus is integrated into external peripheral devices, a solid-state image pickup device which does not require any exceptional integrating technique and which is easily dealt with can be provided.

Further, in the present invention, the print board and the transparent substrate are bonded with the thermosetting resin, and in that case, an electric connection between the print board and each the second projecting electrode of the transparent substrate is surely maintained.

Furthermore, the print board and the transparent substrate are bonded by hermetically sealing the light receiving surface of the solid-state image pickup device with the thermosetting resin.

As a result, only one application of the thermosetting resin is sufficient for hermetic seal, thereby reducing man-hours. Further, as a result, the process of face-down packaging can be performed in a short period of time, thereby reducing possibilities of allowing entry of dirt between the solid-state image pickup device and the transparent substrate and allowing the dirt to damage the light receiving portions of the solid-state image pickup device.

Further, in the present invention, the thermosetting resin is arranged not to be applied in advance in order to prevent a seepage of a thermosetting resin yet to be set into the light receiving portions of the solid-state image pickup device, thus preventing the seepage of the thermosetting resin yet to be set and previously applied into the light receiving portions.

As a result, the solid-state image pickup apparatus capable of reducing man-hours in bonding, improving bonding quality, and being readily integrated into peripheral devices can be provided.

Further, in order to attain the foregoing object, the manufacturing method of the solid-state image pickup apparatus according to the present invention includes the steps of: (i) performing face-down packaging by disposing an inner wiring metal layer phase of a transparent substrate to face a surface electrode phase of a solid-state image pickup device, and connecting first projecting electrodes on the surface electrode phase and inner wiring metal layers of the transparent substrate by ultrasonic bonding; (ii) applying a thermosetting resin to peripheries of each second projecting electrode to be formed in an electrode terminal group on the transparent substrate, and of the solid-state image pickup device; (iii) fixing by pressing a print board, which has an aperture which is as large as the solid-state image pickup device and a non-pin type lead terminal structure, onto the transparent substrate so as to connect the each second projecting electrode of the transparent substrate and each non-pin type lead terminal of the print board, and simultaneously performing hermetic sealing of a surface portion of the solid-state image pickup device with a thermosetting resin; and (iv) applying heat to set the thermosetting resin.

With the foregoing method, face-down packaging is performed by disposing the inner wiring metal layer phase of the transparent substrate to face the surface electrode phase of the solid-state image pickup device. When performing face-down packaging, each the first projecting electrode of the solid-state image pickup device and the inner wiring metal layer of the transparent substrate are connected by ultrasonic bonding.

Next, the thermosetting resin is applied the peripheries of the second projecting electrodes of the transparent substrate and of the solid-state image pickup device, then, the transparent substrate is fixed by pressing it against the print board having the frame aperture which is as large as the solid-state image pickup device, and the non-pin type lead terminal structure, thereby connecting the second projecting electrodes of the transparent substrate and the non-pin type lead terminals of the print board. Here, simultaneously, the surface portion of the solid-state image pickup device is hermetically sealed with the thermosetting resin which is set by the application of heat.

As a result, the solid-state image pickup apparatus can be manufactured in a short period of time, where tasks in the manufacture are simple. In addition, the complete solid-state image pickup apparatus has high bonding quality, which can readily be integrated into peripheral devices via the print board having the non-pin type lead terminal structure.

Consequently, the manufacturing method of the solid-state image pickup apparatus capable of reducing man-hours in bonding, improving bonding quality, and being readily integrated into peripheral devices can be provided.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 7(b) is a cross sectional view showing a state in which the second projecting electrode of the transparent substrate and the non-pin type lead terminal of the print board are joined via conductive particles which is included in the thermosetting resin in between.

FIG. 10(a) is a perspective view showing a state in which a plurality of external device connection terminals to be respectively connected to the non-pin type lead terminals of the print board are disposed.

FIG. 10(b) is a perspective view showing one of the plurality of external device connection terminals.

DESCRIPTION OF THE EMBODIMENTS

The following will explain one embodiment of the present invention with reference to drawings. Note that, a solid-state image pickup device which is adopted in the present embodiment is, like a CCD (Charge Coupled Device) for example, a device which detects optical image information and captures the information by converting it into an electric signal, that is, a solid-state image sensor which corresponds to the human eyes. This solid-state image pickup device is used in various technical fields because of its characteristics which are absent in an imaging tube.

Figure 1A:
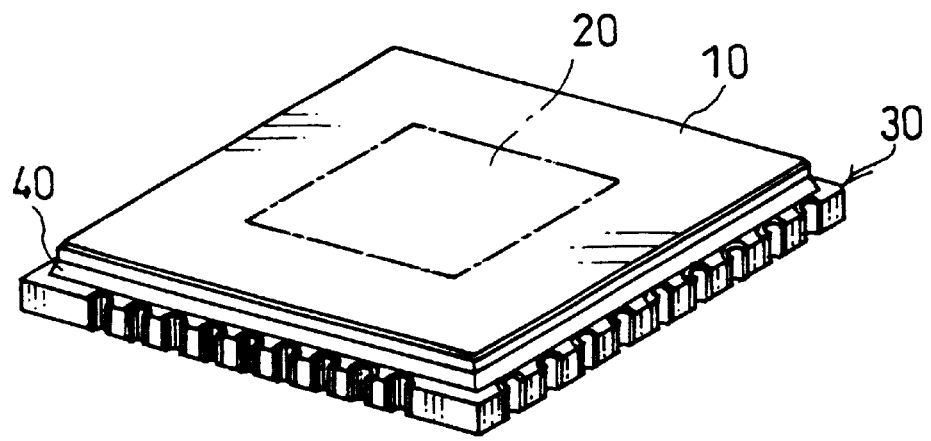
FIG. 1(a) is a perspective view showing one embodiment of a solid-state image pickup apparatus according to the present invention.
Figure 1B:
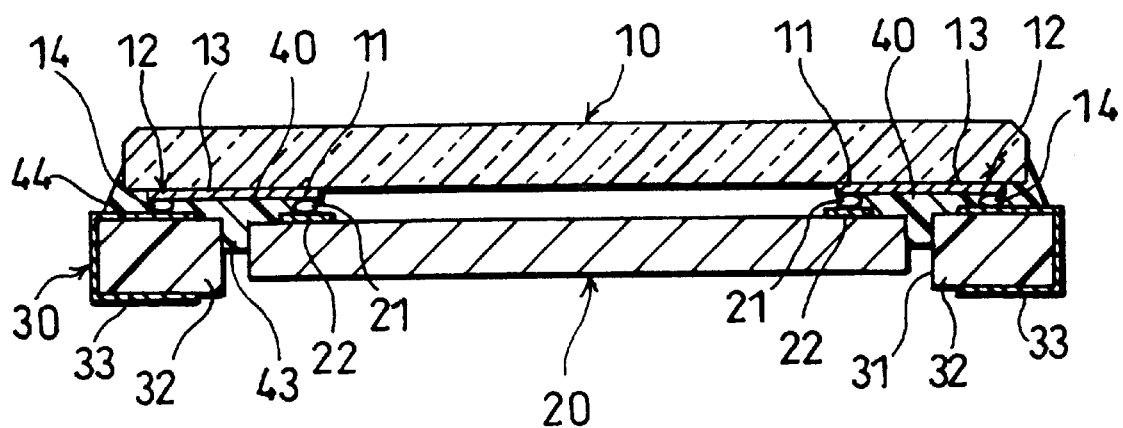
FIG. 1(b) is an end view of the solid-state image pickup apparatus.

The solid-state image pickup apparatus of the present embodiment is, as shown in FIGS. 1(a) and 1(b), made up of a transparent substrate 10 and a solid-state image pickup device 20 which are bonded by face-down packaging (face-down bonding). The transparent substrate 10 is made of glass for example, and includes projecting electrode connection electrode terminals 11 as an inner wiring metal layer formed of an insulating thin film and a conductive thin film which are stacked and not shown, and an electrode terminal group 12 which is externally formed so as to output an electric signal to the outside. The solid-state image pickup device 20 is made up by respectively forming first projecting electrodes 21 corresponding to the projecting electrode connection electrode terminals 11 of the transparent substrate 10 on electric signal I/O terminals 22 as respective surface electrodes.

Note that, the "face-down packaging" generally refers to mounting such that surface electrodes or wiring leads which are previously provided on an IC semiconductor chip such as the solid-state image pickup device 20, and wiring electrodes which are formed on an insulating substrate are kept in close contact by facing one another, thereby electrically connecting to one another.

The projecting electrode connection electrode terminals 11 of the transparent substrate 10 and the first projecting electrodes 21 of the solid-state image pickup device 20 are connected by ultrasonic bonding in the present embodiment.

The ultrasonic bonding in general is a method of solid-phase welding of an electrode pad and a bump, etc., by application of ultrasound and pressure with respect to a joint portion. More specifically, by applying a constant amount of pressure while concurrently applying ultrasound with respect to the joint portion, a plastic flow occurs in the bump, etc., as in the case of applying pressure under a high temperature. This plastic flow is accompanied by a wavy flow due to an ultrasonic oscillation, concurrently with macroscopic deformation of the bump, etc. This destroys an oxide film in both metallic interfaces, thereby occurring a joint by contacting a newly generated surface. In addition, in the ultrasonic bonding, welding is performed in the form of a doughnut in a periphery of the center of the pressure applied, but not in the center of the pressure applied. By the ultrasonic bonding, both electric and mechanical connections are more firmly made.

On the other hand, the second projecting electrodes 14 are respectively formed on the electrode terminals 13 of the electrode terminal group 12 of the transparent substrate 10. Further, to the transparent substrate 10 is joined a print board 30 having a frame aperture 31 which is as large as (more accurately, slightly larger than) the solid-state image pickup device 20, by electrically connecting each second projecting electrode 14 of the transparent substrate 10 and by hermetically sealing a light receiving portion of the solid-state image pickup device 20 with a thermosetting resin 40.

The print board 30 has a non-pin type lead terminal structure (LCC structure, i.e., Leadless Chip Carrier structure). As shown in FIG. 1(b), non-pin type lead terminals 33 are formed on a lattice frame 32 of the print board 30, a cross section of which has a rectangular shape, so that the non-pin type lead terminals 33 substantially cover all the phases of the lattice frame 32, except one side on which the frame aperture 31 is formed. Thus, it is arranged that the lead terminals 33 do not extend from the print board 30 by taking the form of a pin. Note that, the meaning of a "lattice" of the lattice frame 32 will be explained later.

Further, the non-pin type lead terminals 33 are not limited to the foregoing arrangement, but alternatively, there may be adopted an arrangement in which the non-pin type lead terminals 33 are extended from the second projecting electrodes 14 to the outside of the lattice frame 32 so that the lead terminals 33 cover one side of the lattice frame 32 so as to electrically connect the second projecting electrodes 14 and an external device.

Further, between the print board 30 and the solid-state image pickup device 20 is formed a fillet for devices (hereinafter referred to as "device fillet") 43, and a fillet for substrates (hereinafter referred to as "substrate fillet") 44 is formed between the print board 30 and the transparent substrate 10. Here, a "fillet" in general refers to an adhesive portion which fills a nook or a corner to be formed in a place where two materials to be adhered are joined. In the present embodiment, as shown in FIG. 1(b), the device fillet 43 covers one side of the solid-state image pickup device 20, and the substrate fillet 44 slightly covers one side of the print board 30.

In the solid-state image pickup device 20, an incident light in the case of the photo shooting of a subject passes the transparent substrate 10, and is incident on a light receiving area of the solid-state image pickup device 20 which is not shown. In the light receiving area, for example, 0.2 million to 0.4 million pieces of light receiving portions which are called photo diodes are formed. Note that, from the face that the light receiving portions themselves are fine, photosensitivity is in danger of reduction. Therefore, recently, microlenses made of resin are often formed on the light receiving portions so as to increase photosensitivity.

Consequently, an incident light on the light receiving area is converged at a micro lens (not shown) provided on a surface of the solid-state image pickup device 20 before it is incident on the light receiving portions, then, the incident light is converted into an electric signal and outputted by the electrode terminal group 12 so as to be dealt with as image data.

Further, a space between the solid-state image pickup device 20 and the transparent substrate 10 is not sealed with a resin. Accordingly, when receiving light, the micro lens formed on the light receiving area of the solid-state image pickup device 20 can converge the incident light on the light receiving area without losing its function.

Next, the following will explain a manufacturing method of the solid-state image pickup apparatus having the foregoing structure and a connecting method thereof to external devices.

Figure 2:
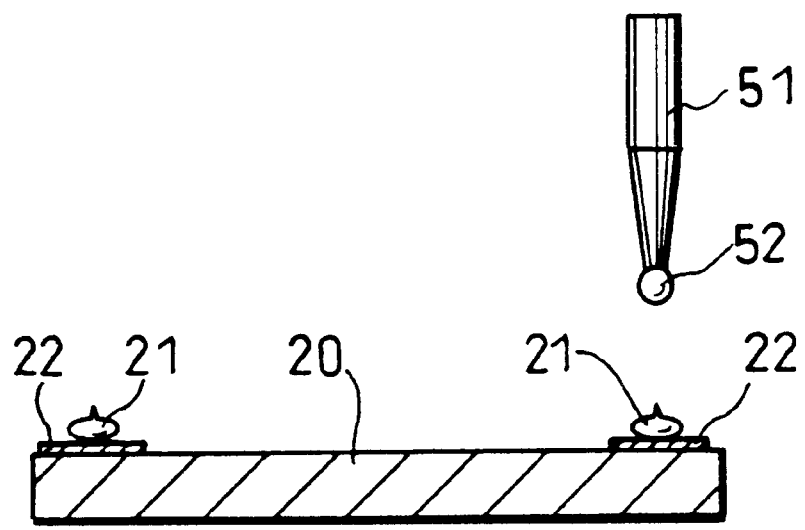
FIG. 2 is a cross sectional view showing the manufacturing step of forming a first projecting electrode on a solid-state image pickup device of the solid-state image pickup apparatus.

First, as shown in FIG. 2, the first projecting electrodes 21 as bumps with respect to the electric signal I/O terminals 22 of the solid-state image pickup device 20 are formed. The formation of the first projecting electrodes 21 is carried out by, for example, a ball bump method. More specifically, using a capillary 51 for wire-bonding, an electrostatic discharge from the tip of an Au wire is performed to form a ball 52 which is crimped by heat onto each of the electric signal I/O terminals 22. Then, the capillary 51 is pulled up to the above while keeping the Au wire fixed so as to cut off the Au wire at a top portion of the ball 52.

Note that, in the case of adopting a solid-state image pickup device 20 on which the first projecting electrodes 21 are previously formed by an electric plating method through the step of plating in a wafer manufacturing process, the present manufacturing step is not required.

Figure 3:
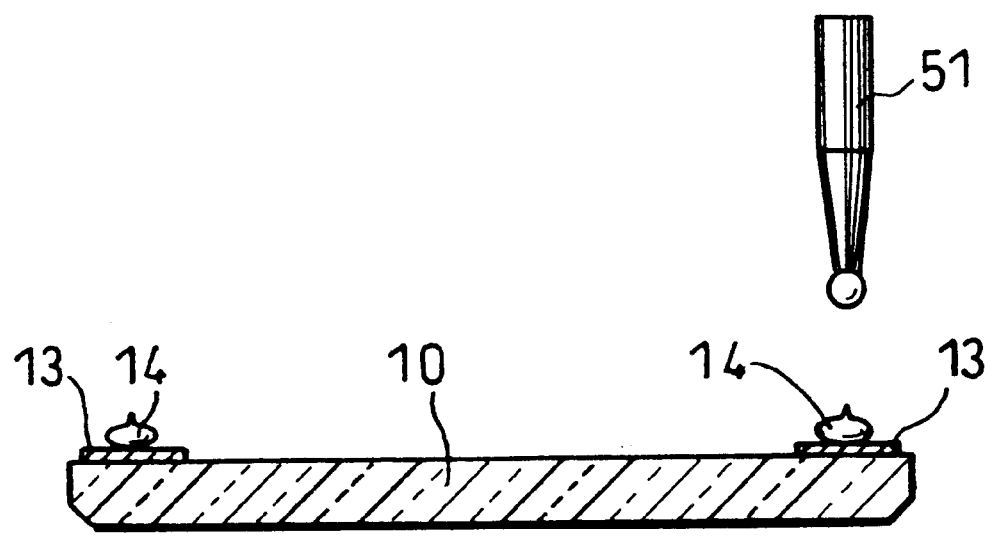
FIG. 3 is a cross sectional view showing the manufacturing step of forming a second projecting electrode on a transparent substrate of the solid-state image pickup apparatus.

Next, as shown in FIG. 3, the second projecting electrodes 14 are formed in the same manner with respect to the electrode terminals 13 which are input terminals of an electric signal to the outside provided on the transparent substrate 10, to which the face-down packaging of the solid-state image pickup device 20 is performed. Note that, the present manufacturing step is not required, either, in the case of using a transparent substrate 10 on which the second projecting electrodes 14 are prepared in advance.

Figure 4:
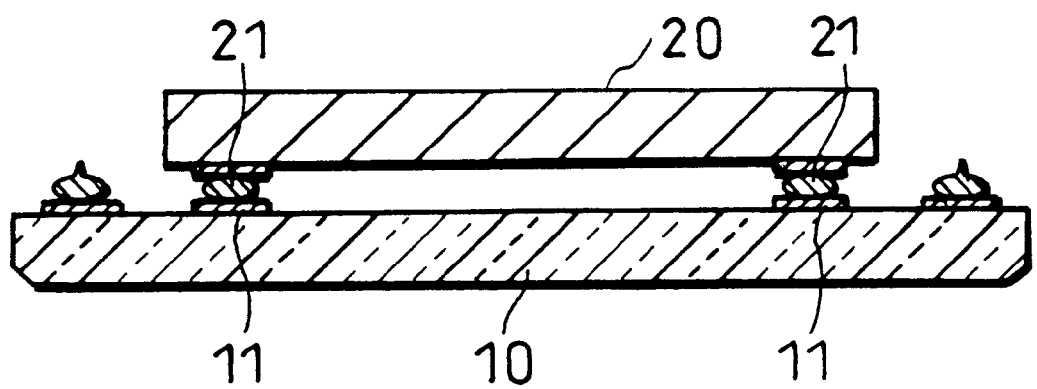
FIG. 4 is a cross sectional view showing the manufacturing step of performing face-down packaging of the solid-state image pickup device of the solid-state image pickup apparatus with respect to the transparent substrate.

Next, as shown in FIG. 4, the face-down packaging by ultrasonic bonding is performed with respect to the first projecting electrodes 21 which were formed on the solid-state image pickup device 20 in the previous step and the projecting electrode connection electrode terminals 11 which are formed on the transparent substrate 10.

When the solid-state image pickup device 20 is bonded to the transparent substrate 10 by ultrasonic bonding, it is necessary to maintain a space between the solid-state image pickup device 20 and the transparent substrate 10. In the present embodiment, with regard to a control of the space, it is controlled up to how many microns the first projecting electrodes 21 move, i.e., sink after the first projecting electrodes 21 come in contact with the projecting electrode connection electrode terminals 11 of the transparent substrate 10.

Figure 5:
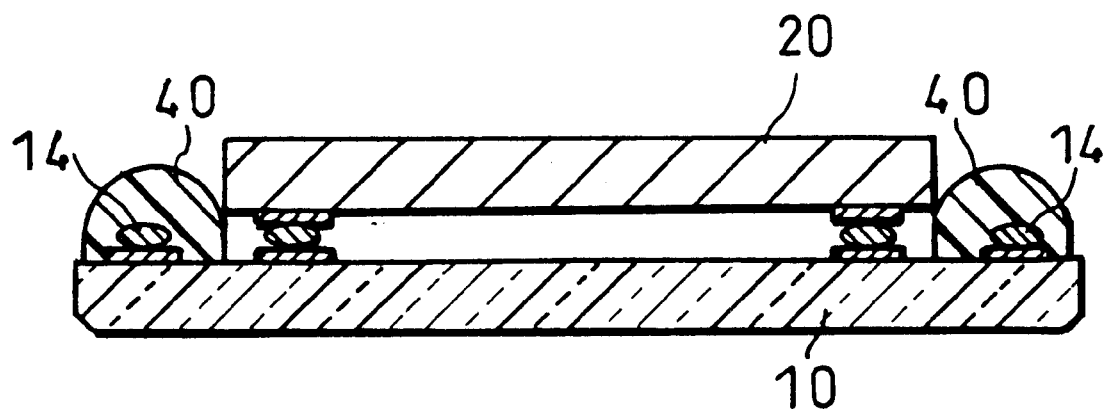
FIG. 5 is a cross sectional view showing the manufacturing step of applying a thermosetting resin to one side of the solid-state image pickup device which is bonded to the transparent substrate by the face-down packaging in the solid-state image pickup apparatus.

Next, as shown in FIG. 5, the thermosetting resin 40 such as Anisotropic Conductive Paste (ACP) is applied to a position of the second projecting electrodes 14 of the transparent substrate 10 to which the face-down packaging of the solid-stage image pickup device 20 was performed. As to an applying method, a method such as a stamp method or a print method may be adopted. In addition, a dispensing method for injecting a resin as in the case of injection by an injector may also be adopted.

Figure 6:
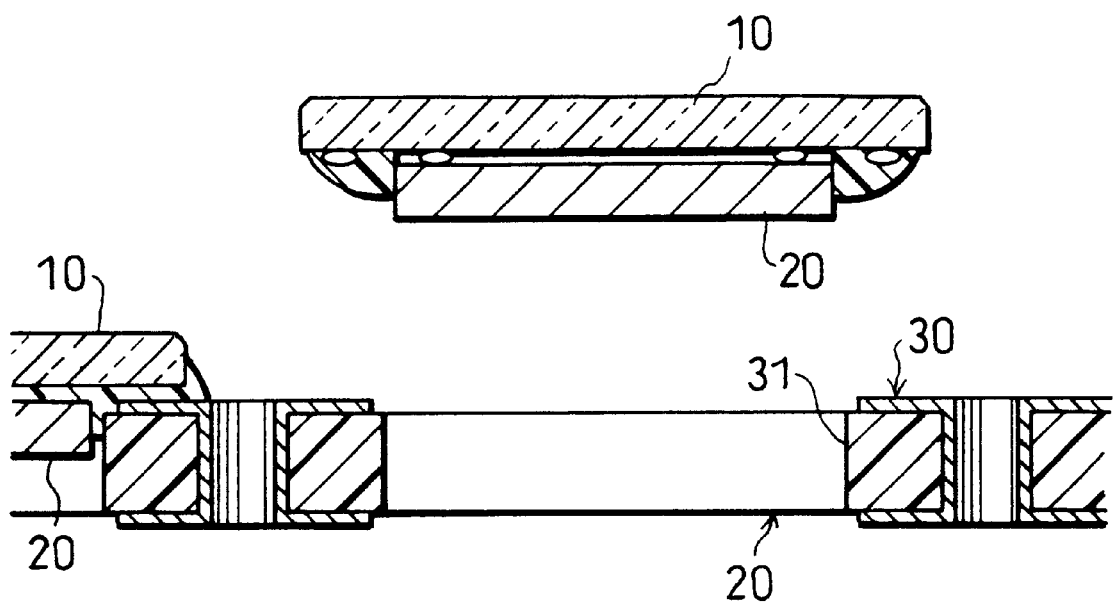
FIG. 6 is a cross sectional view showing a state in which the transparent substrate which is bonded to the solid-state image pickup device by the face-down packaging is joined to a print board.

At the end of the step, the solid-state image pickup device 20 is inserted, as shown in FIGS. 1(a) and 1(b), into the frame aperture 31 on the print board 30, the center portion of which is cut out in the shape of the solid-state image pickup device 20 as shown in FIG. 6. Next, the transparent substrate 10 to which the thermosetting resin 40 was applied is pressed against the print board 30, thereby electrically connecting the second projecting electrodes 14 of the transparent substrate 10 and the lead terminals 33 formed on the print board 30. In addition, simultaneously, the device fillet 43 is formed around the solid-state image pickup device 20 by using the thermosetting resin 40 so as to fill a gap between the solid-state image pickup device 20 and the print board 30. Likewise, the substrate fillet 44 is formed around the transparent substrate 10 by using the thermosetting resin 40 so as to fill a gap between the print board 30 and the transparent substrate 10. With the device fillet 43 and the substrate fillet 44, adhesive strength between the solid-state image pickup device 20 and the print board 30, and adhesive strength between the transparent substrate 10 and the print board 30 are respectively increased, thereby increasing adhesive strength between the solid-state image pickup device 20 and the transparent substrate 10.

Further, by thus pressing the transparent substrate 10 against the print board 30, the bonding of the transparent substrate 10 and the print board 30, and the hermetic seal of the light receiving surface of the solid-state image pickup device 20 are concurrently carried out, using the thermosetting resin 40.

Figure 7A:
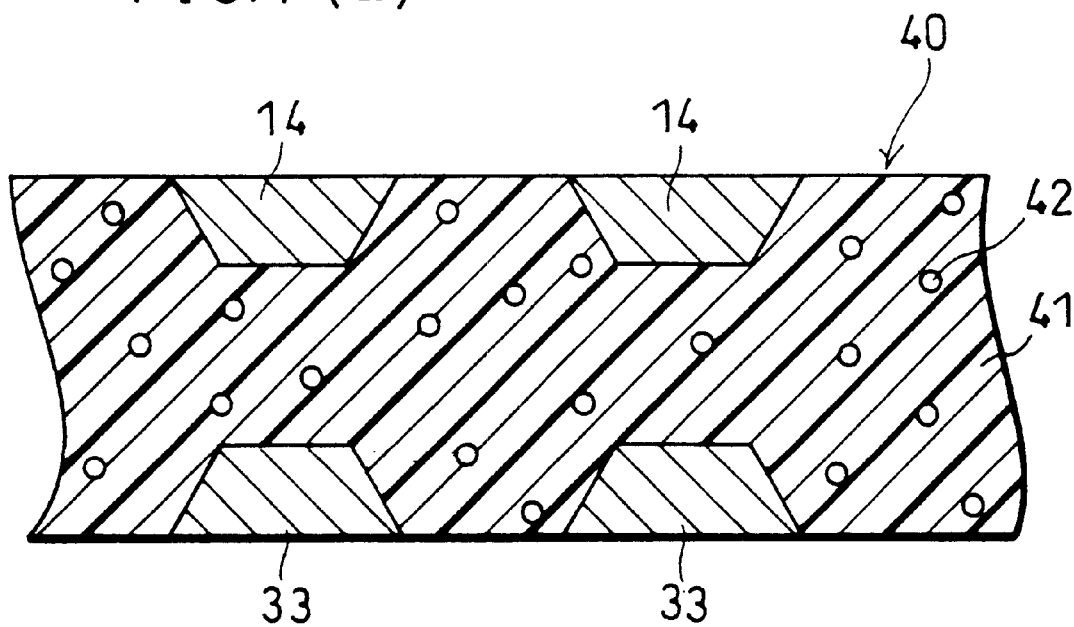
FIG. 7(a) is a cross sectional view showing a state in which a thermosetting resin made of anisotropic conductive paste which is used in manufacturing the solid-state image pickup apparatus is applied between the second projecting electrode of the transparent substrate and a non-pin type lead terminal of the print board.
Figure 7B:
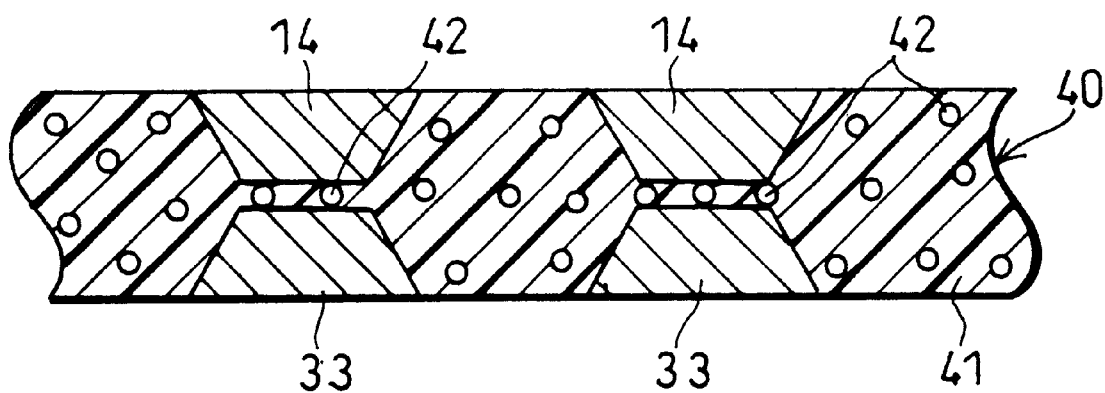

Here, in the present embodiment, the second projecting electrodes 14 and the lead terminals 33 are electrically connected via the thermosetting resin 40 made of anisotropic conductive paste. This thermosetting resin 40 made of anisotropic conductive paste is, for example, different from conductive paste which is made of metal only such as Ag paste, and as shown in FIG. 7(a), it is composed of a resin 41 in which conductive particles 42 are mixed. Therefore, by pressing the transparent substrate 10 against the print board 30, the second projecting electrodes 14 on the side of the transparent substrate 10 and the lead terminals 33 on the side of the print board 30 move closer to one another so as to be joined via the conductive particles 42 in between. Namely, the second projecting electrodes 14 on the side of the transparent substrate 10 and the lead terminals 33 on the side of the print board 30 are electrically connected via the conductive particles 42.

As a result, when using the thermosetting resin 40 made of anisotropic conductive paste, the electric connection can be made depending on a joint direction of the transparent substrate 10 and the print board 30 when pressing them. On the other hand, the surfaces of the transparent substrate 10 and the print board 30 in a direction perpendicular to the joint direction are insulated. Consequently, an electrical short-circuit defect does not occur either between the adjacent second projecting electrodes 14 or between the adjacent lead terminals 33.

Thereafter, heat having a setting temperature is applied to the thermosetting resin 40 so as to set the resin component 41, thereby hermetically sealing the light receiving surface of the solid-state image pickup device 20, while simultaneously increasing joint strength among the solid-state image pickup device 20, the transparent substrate 10 and the print board 30.

Figure 8A:
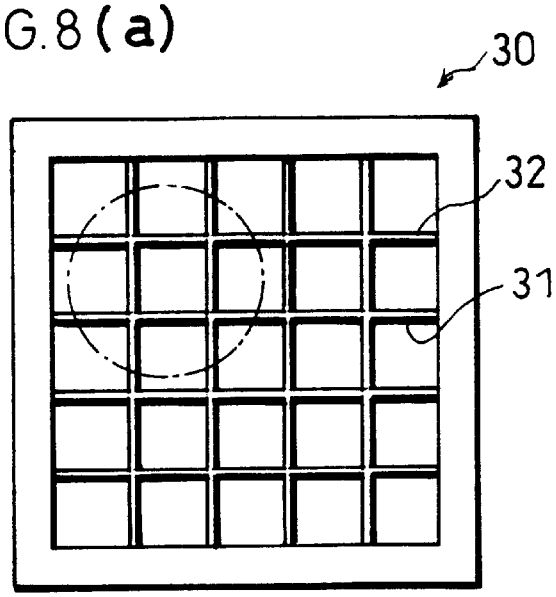
FIG. 8(a) is a plan view showing a print board having a lattice frame which is used in manufacturing the solid-state image pickup apparatus.

Meanwhile, in the manufacturing method of the solid-state image pickup apparatus of the present embodiment, as explained, the transparent substrate 10 which is mounted on the solid-state image pickup device 20 by the face-down packaging is fitted to the print board 30. The print board 30 is, as shown in FIG. 8(a), made up of the lattice frame 32. In addition, each space in a lattice of the lattice frame 32 is the frame aperture 31.

Figure 8B:
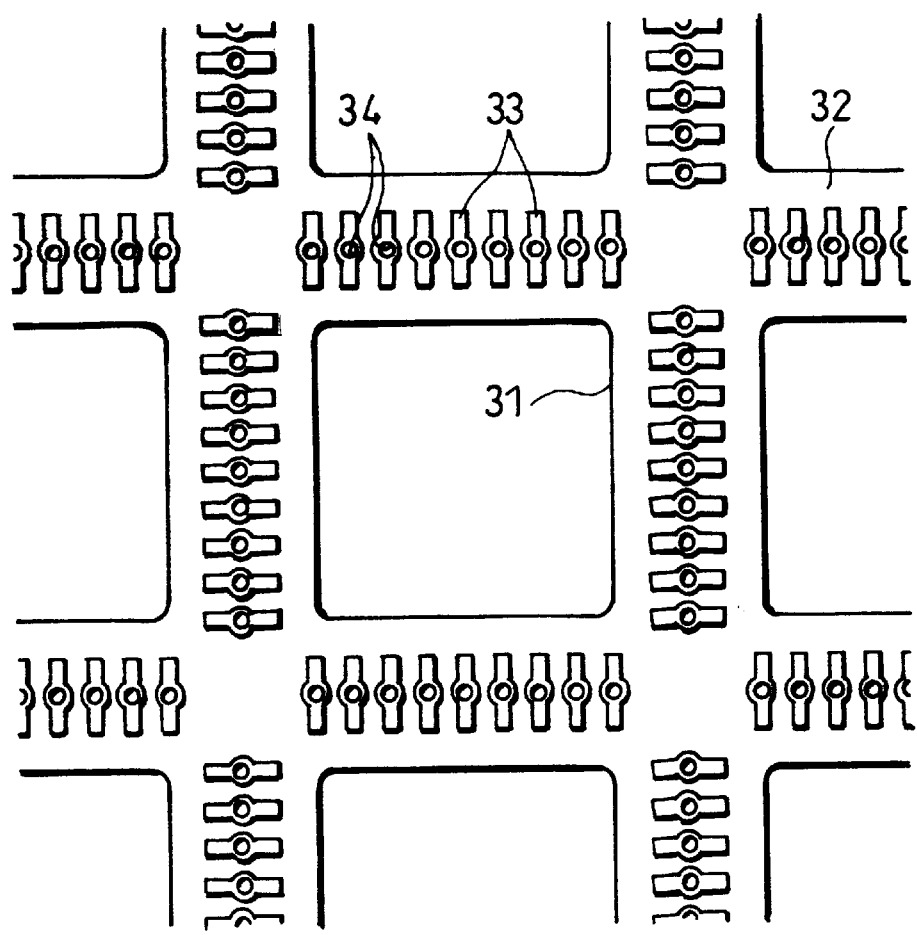
FIG. 8(b) is a plan view showing a magnified view of the print board.

Furthermore, in the lattice frame 32, as shown in FIG. 8(b), along the lattice is disposed the plurality of non-pin type lead terminals 33 in matrix. Moreover, each of the lead terminals 33 has one of a plurality of through holes 34 in the center.

Figure 9:
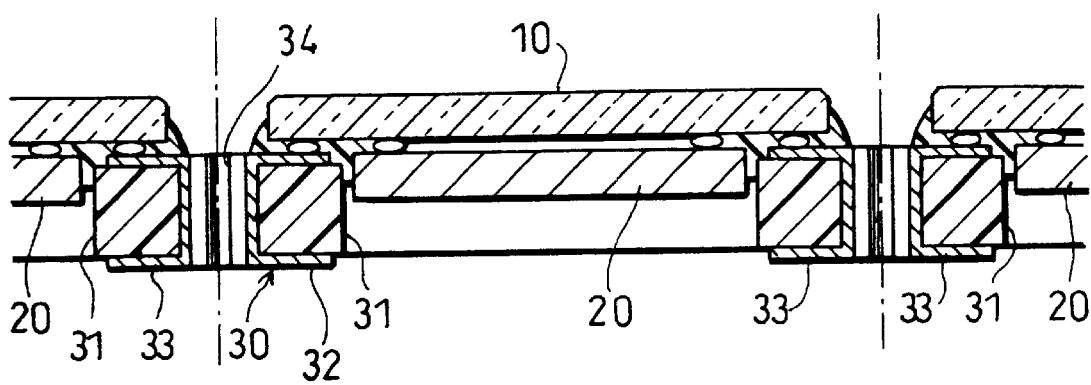
FIG. 9 is a cross sectional view showing a state in which the solid-state image pickup device and the transparent substrate which are bonded by the face-down packaging are joined to the print board.

Namely, in the manufacturing method of the solid-state image pickup apparatus of the present embodiment, as shown in FIG. 9, with respect to the print board 30 made up of the lattice frame 32 can be fitted a plurality of solid-state image pickup devices 20.

Accordingly, in the manufacturing method of the solid-state image pickup apparatus of the present embodiment, into the frame apertures 31 of the lattice frame 32 are inserted the solid-state image pickup devices 20 which are subjected to the face-down packaging, and the print board 30 and the transparent substrate 10 are bonded, and thereafter, it is arranged that the print board 30 made up of the lattice frame 32 is cut up by dicing at the positions of the through holes 34 for each of the solid-state image pickup devices 20.

Note that, "dicing" in general refers to such that a wafer is cut, while making a grinder having a diamond abrasive grain embedded therein rotated at a high speed so as to separate and divide a semiconductor device (chip) from the wafer.

When connecting the lead terminals 33 of thus manufactured solid-state image pickup apparatus to an external device, as shown in FIGS. 10(*a*) and 10(*b*), an external device connection terminal group 60 in which soldering paste 62 was applied to tips of the respective external device connection terminals 61 are disposed in a rectangular form.

Figure 11A:
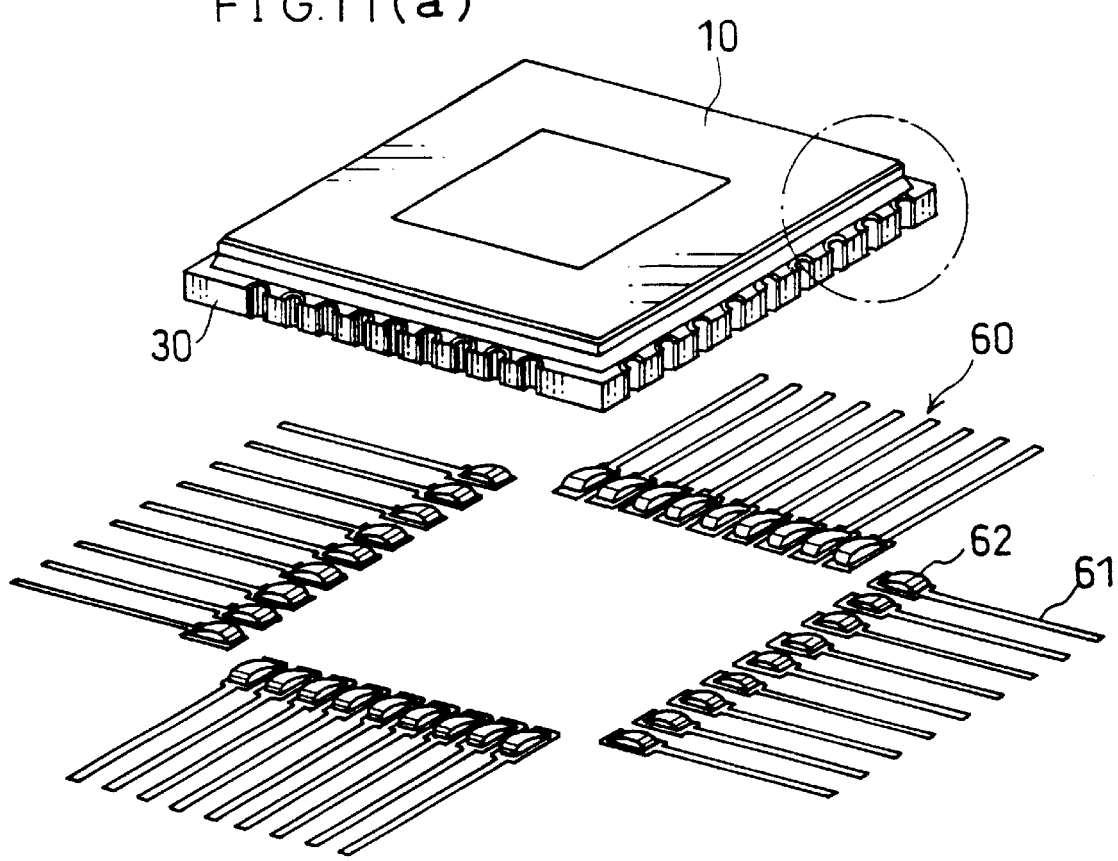
FIG. 11(a) is a perspective view showing a state immediately before the connection of the plurality of external device connection terminals to be respectively connected to the non-pin type lead terminals of the print board with respect to the print board on which the solid-state image pickup device and the transparent substrate bonded by the face-down packaging were mounted.
Figure 11B:
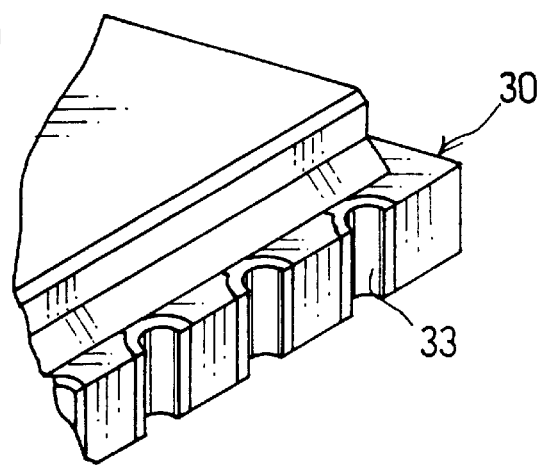
FIG. 11(b) is a perspective view of a main portion showing a magnified view of the print board.
Figure 12:
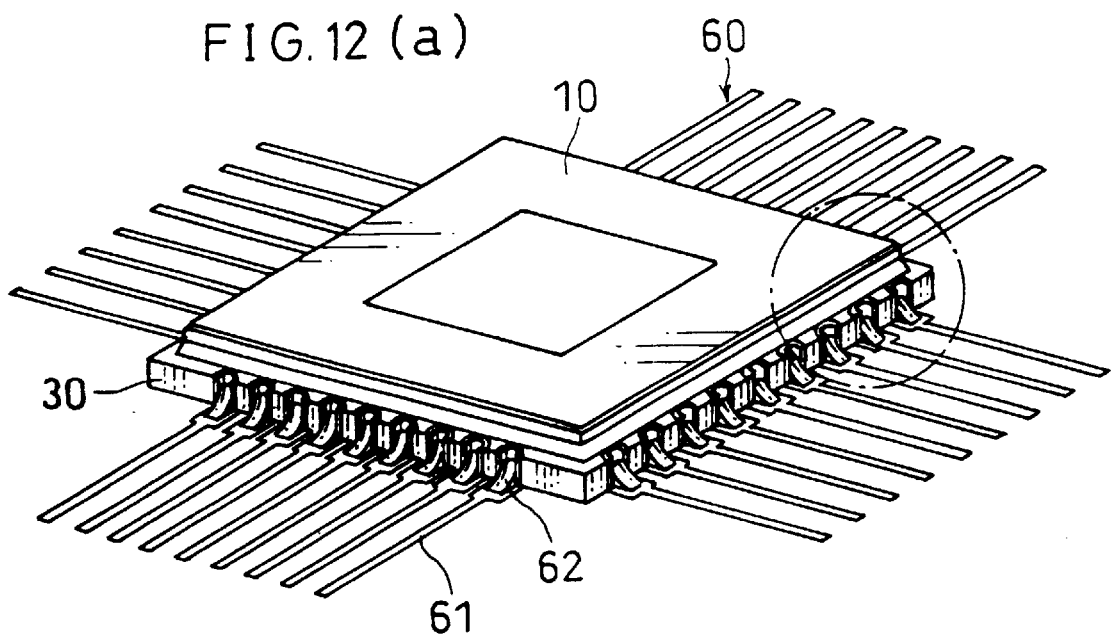
FIG. 12(a) is a perspective view showing a state in which the plurality of external device connection terminals to be respectively connected to the non-pin type lead terminals of the print board are connected to the print board on which the solid-state image pickup device and the transparent substrate which are bonded by the face-down packaging are mounted.
FIG. 12(b) is a perspective view of a main portion showing details of a connecting state of the plurality of external device connection terminals and the print board.
FIG. 12(c) is a cross sectional view showing details of the connecting state of the plurality of external device connection terminals and the print board.
Figure 12:
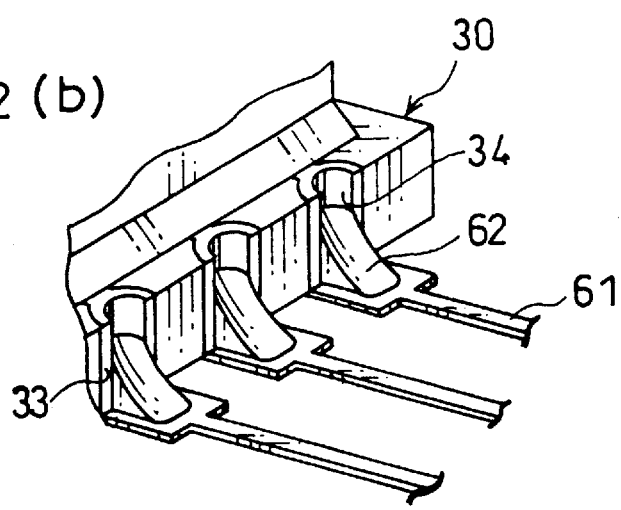
Figure 12:
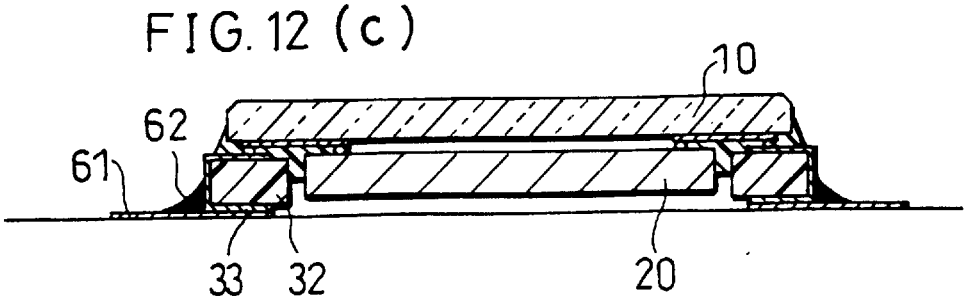
Figure 13:
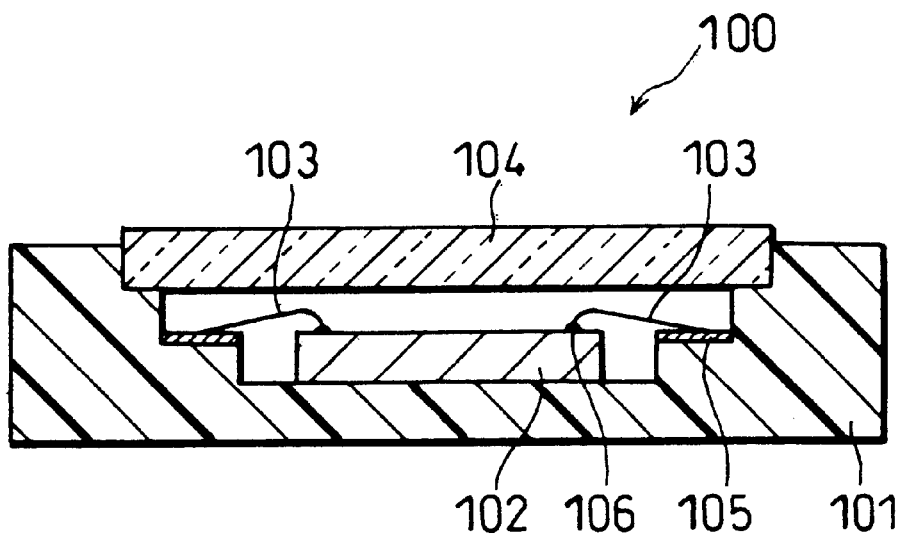
FIG. 13 is a cross sectional view showing a conventional solid-state image pickup apparatus.
Figure 14:
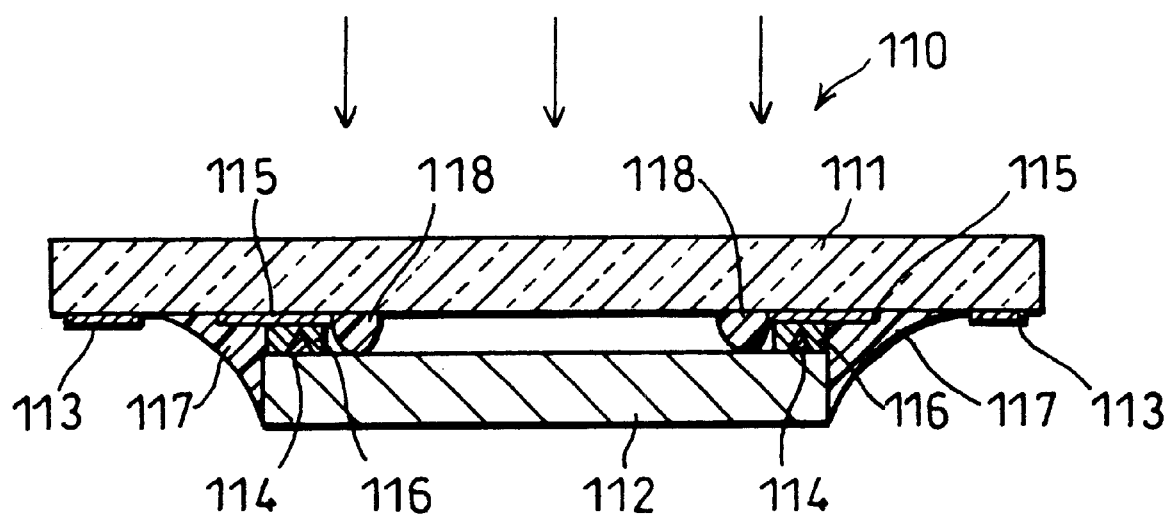
FIG. 14 is a cross sectional view showing another conventional solid-state image pickup apparatus.

Next, as shown in FIGS. 11(*a*) and 11(*b*), above the external device connection terminal group 60 is disposed the print board 30 to which the solid-state image pickup device 20 is fitted. Then, as shown in FIGS. 12(*a*), 12(*b*) and 12(*c*), each of the external device connection terminals 61 is deposited on a side wall of each of lead terminals 33, which is arranged to have a semi-cylindrical shape by cutting the through holes 34 of the print board 30, by applying a heated soldering paste 62 with a tool such as a soldering iron, thereby respectively connecting the lead terminals 33 and the external device connection terminals 61.

Not that, in the case of connecting the external device connection terminals 61, it is also possible that a mask is worn not to receive light by the light receiving surface of the solid-state image pickup device 20, and apply near-infrared radiation for heating.

As a result, in the solid-state image pickup apparatus of the present embodiment, the soldering connection manufacturing method can be adopted intact, thus readily connecting to the external device without requiring mounting devices having a highly accurate image recognizing mechanism.

As a result, the solid-state image pickup apparatus of the present embodiment has a wide range of usage as a component of various devices and apparatus, and it is also advantageous in terms of operations for assembly, and can be adopted in a convenient assembly device.

Here, in the present embodiment, glass is used as the transparent substrate 10. However, a material of the transparent substrate 10 is not limited to this, and an optical filter, for example, may also be used.

Namely, when the solid-state image pickup device 20 is mounted on a camera, for example, image light is inputted via an optical system such as a lens when incident on the solid-state image pickup device 20. In that case, in accordance with a state of the light, the use of an optical filter which is made up of a glass material in an optical input system of the camera results in an improved ease of use. Note that, looking ahead, not only a glass material but also a plastic material such as an acrylic resin can be adopted as the optical filter.

Thus, the solid-state image pickup apparatus of the present embodiment is made up of the transparent substrate 10 including the projecting electrode connection electrode terminals 11 which are formed of the insulating thin film and the conductive thin film stacked, and the electrode terminal group 12 which is formed outside so as to output an electric signal to the outside, and the solid-state image pickup device 20 in which the first projecting electrodes 21, corresponding to the projecting electrode connection electrode terminals 11 of the transparent substrate 10, are respectively formed on the electric signal I/O terminals 22, the transparent substrate 10 and the solid-state image pickup device 20 being bonded by face-down packaging.

Accordingly, a compact and thin solid-state image pickup apparatus, the size of which is closer to outer dimensions of the solid-state image pickup device 20 than the size of a solid-state image pickup apparatus adopting wire-bonding, can be realized.

Here, in the present embodiment, the projecting electrode connection electrode terminals 11 of the transparent substrate 10 are connected with the first projecting electrodes 21 of the solid-state image pickup device 20 by ultrasonic bonding.

That is, in the case of a conventional face-down packaging of the solid-state image pickup device 20 and the transparent substrate 10, by dotting the first projecting electrodes 21 with the conductive adhesive, the first projecting electrodes 21 of the solid-state image pickup device 20 and the projecting electrode connection electrode terminals 11 of the transparent substrate 10 were electrically connected, thus resulting in problems such as a complication of manufacturing steps and an increase in man-hours.

However, in the present embodiment, ultrasonic bonding is adopted to connect the projecting electrode connection electrode terminals 11 of the transparent substrate 10 and the first projecting electrodes 21 of the solid-state image pickup device 20. The ultrasonic bonding is such a method as to apply pressure and ultrasound to joint portions among the projecting electrode connection electrode terminals 11 and the first projecting electrodes 21 so as to perform solid-state welding, and thus simplifying and ensuring the joint.

As a result, the solid-state image pickup apparatus capable of reducing man-hours in bonding and improving bonding quality can be provided.

On the other hand, conventionally, the solid-state image pickup device 20 and the transparent substrate 10 were simply bonded by the face-down packaging, and therefore, the electrode terminal group 12 of the transparent substrate 10 was pointed toward the side of the solid-state image pickup device 20. Furthermore, since the formation portion of the electrode terminal group 12 is a small area, there was such a problem that connection for outputting an electric signal from the electrode terminal group 12 to the outside was difficult.

However, in the present embodiment, the electrode terminal group 12 of the transparent substrate 10 is connected with the print board 30 having the non-pin type lead terminal structure via the second projecting electrodes 14 respectively formed on the electrode terminals 13 of the electrode terminal group 12.

Accordingly, a signal to the outside can be outputted from a rear side of the print board 30 via the non-pin type lead terminals 33 which are formed on the print board 30. As a result, the output from the transparent substrate 10, i.e., the output from the solid-state image pickup device 20 can readily be obtained, and therefore, when the present solid-state image pickup apparatus is integrated into external peripheral devices, a solid-state image pickup apparatus which does not require any exceptional integrating technique and which is easily dealt with can be provided.

Further, in the solid-state image pickup apparatus of the present embodiment, a space under the solid-state image pickup device 20 can effectively be used. That is, other electronic components, etc., can be mounted in this space, thereby contributing to high-density mounting of the entire solid-state image pickup apparatus.

Namely, when mounting the solid-state image pickup apparatus, because of the presence of the print board 30, workability is improved, and thereby a large-scale mounting device is no longer required, and the range of application can vary to meet diverse requirements.

Further, in the present embodiment, the print board 30 and the transparent substrate 10 are bonded with the thermosetting resin 40, while surely maintaining an electric connection between the print board 30 and the second projecting electrodes 14 of the transparent substrate 10.

Furthermore, the print board 30 and the transparent substrate 10 are bonded so as to hermetically seal the light receiving surface of the solid-state image pickup device 20 with the thermosetting resin 40.

As a result, only one application of the thermosetting resin 40 is sufficient for hermetic seal, thereby reducing man-hours. Further, as a result, the process of face-down packaging can be performed in a short period of time, thereby reducing possibilities of allowing entry of dirt between the solid-state image pickup device 20 and the transparent substrate 10 and allowing the dirt to damage the light receiving portions of the solid-state image pickup device 20. Particularly, in the present embodiment, from the facts that, during the face-down packaging, the thermosetting resin 40 is not used, and that the process is simple, it is held that there is little possibility of allowing adhesion of dirt. Assuming that the dirt adhered, if it was prior to the application of the thermosetting resin 40, an air gun, etc., can remove the dust.

Further, in the present embodiment, in order to prevent a seepage of a thermosetting resin yet to be set, which is previously applied, into the light receiving portions of the solid-state image pickup device 20, the thermosetting resin is arranged not to be applied in advance, thus preventing the seepage of the thermosetting resin yet to be set and previously applied into the light receiving portions.

As a result, the solid-state image pickup apparatus capable of reducing man-hours in bonding, improving bonding quality, and being readily integrated into peripheral devices can be provided.

Further, in the solid-state image pickup apparatus of the present embodiment, the device fillet 43 and the substrate fillet 44 made of thermosetting resin are respectively formed between the print board 30 and the solid-state image pickup device 20, and between the print board 30 and the transparent substrate 10.

Accordingly, the space between the print board 30 and the solid-state image pickup device 20, and the space between the print board 30 and the transparent substrate 10 are respectively fortified by the device fillet 43 and the substrate fillet 44 which are made of the thermosetting resin 40. Namely, connection strength between the solid-state image pickup device 20 and the transparent substrate 10 can be increased.

As a result, bonding quality can be improved, thereby improving the quality of the solid-state image pickup apparatus.

Further, in the solid-state image pickup apparatus of the present embodiment, the transparent substrate 10 is made up of either glass or an optical filter.

Accordingly, by using glass which is commonly used as a substrate and through which visible light is transmitted, the substrate can be formed at a low cost. Further, when using the optical filter, for example, a substrate, which is suitable for receiving the image light of a camera and the like, can be formed.

Further, in the manufacturing method of the solid-state image pickup apparatus of the present embodiment, when manufacturing the solid-state image pickup apparatus, first, the first projecting electrodes 21 are respectively formed on the electric signal I/O terminals 22 of the solid-state image pickup device 20, while forming the second projecting electrodes 14 on the electrode terminal group 12 for outputting an electric signal to the outside of the transparent substrate 10 on the outside of which are formed the projecting electrode connection electrode terminals 11, which were formed of the insulating thin film and the conductive thin film stacked, and the electrode terminal group 12.

Next, face-down packaging is performed by arranging a surface of the transparent substrate 10 with the projecting electrode connection electrode terminals 11 to face a surface of the solid-state image pickup device 20 with the electric signal I/O terminals 22. When performing face-down packaging, the first projecting electrodes 21 of the solid-state image pickup device 20 and the projecting electrode connection electrode terminals 11 of the transparent substrate 10 are connected by ultrasonic bonding.

Next, the thermosetting resin 40 is applied the peripheries of the second projecting electrodes 14 of the transparent substrate 10 and of the solid-state image pickup device 20. Then, the transparent substrate 10 is fixed by pressing it against the print board 30 having the frame aperture 31 which is as large as the solid-state image pickup device 20, and the non-pin type lead terminal structure, thereby connecting the second projecting electrodes 14 of the transparent substrate 10 and the lead terminals 33 of the print board 30. Here, simultaneously, the surface portion of the solid-state image pickup device 20 is hermetically sealed with the thermosetting resin 40 which is set by the application of heat.

As a result, the solid-state image pickup apparatus can be manufactured in a short period of time, and tasks in the manufacture are simple. In addition, the complete solid-state image pickup apparatus has high bonding quality, which can readily be integrated into peripheral devices via the print board 30.

Consequently, the manufacturing method of the solid-state image pickup apparatus capable of reducing man-hours in bonding, improving bonding quality, and being readily integrated into peripheral devices can be provided.

Further, in the manufacturing method of the solid-state image pickup apparatus of the present embodiment, as the thermosetting resin 40 is adopted a thermosetting resin made of anisotropic conductive paste including the conductive particles 42 which are dispersed in the resin 41.

Namely, when using the thermosetting resin made of anisotropic conductive paste including the conductive particles 42 which are dispersed in the resin 41 as the thermosetting resin 40, in the case of joining the second projecting electrodes 14 which are formed on the electrode terminals 13 of the electrode terminal group 12 of the transparent substrate 10 and the lead terminals 33 of the print board 30, first, in the joint direction, they are joined so as to sandwich the conductive particles 42 in the resin 41, thereby obtaining the electric connection. On the other hand, on a surface vertically intersecting in the joint direction, the conductive particles 42 are dispersed in the resin 41, thus failing to obtain the electric connection.

As a result, when using the thermosetting resin made of anisotropic conductive paste including the conductive particles 42 which are dispersed in the resin 41 as the thermosetting resin 40, the thermosetting resin 40 can be applied over the entire surface including all the second projecting electrodes 14 formed on the electrode terminals 13 of the electrode terminal group 12 on the transparent substrate 10. Namely, this does not cause a short-circuit defect to occur among the second projecting electrodes 14.

As a result, the thermosetting resin 40 can be applied more easily and in a shorter period of time than applying it by dotting. In addition, this makes it possible to simultaneously apply a resin to hermetically seal the light receiving portions of the solid-state image pickup device 20.

Consequently, man-hours can surely be reduced.

Further, in the manufacturing method of the solid-state image pickup apparatus of the present embodiment, the print board 30 having the non-pin type lead terminal structure in the lattice frame 32 in which a plurality of lead terminals 33 are disposed in matrix is formed. Then, the solid-state image pickup devices 20 are respectively inserted into the frame apertures 31 of the print board 30 which is made up of the lattice frame 32, and the print board 30 and the transparent substrate 10 are bonded, and thereafter, the print board 30 made up of the lattice frame 32 is cut up by dicing for each of the solid-state image pickup devices 20.

As a result, a plurality of the solid-state image pickup apparatuses can efficiently be formed.

Note that, in the present embodiment, the thermosetting resin 40 made of anisotropic conductive paste is adopted. However, in the present invention, the thermosetting resin 40 should not necessarily be the anisotropic conductive paste.

That is, as explained, the use of the thermosetting resin 40 made of anisotropic conductive paste can increase certainty in the electrical connection of the second projecting electrodes 14 of the transparent substrate 10 and the lead terminals 33 in print wirings 33 of the print board 30. In addition, even when using a thermosetting resin (NCP: Non-Conductive adhesive Paste) other than the anisotropic conductive paste, by fully pressing the print board 30 against the side of the transparent substrate 10, the electric connection therebetween is maintained.

Further, in the present embodiment, it is arranged that the solid-state image pickup device 20 is first bonded to the transparent substrate 10 by face-down packaging, and thereafter, the transparent substrate 10 is mounted on the print board 30. However, the arrangement is not limited to this, and as is clear from the structure shown in FIG. 1(b), for example, these components can be mounted at once by improving a mounting equipment. By mounting the solid-state image pickup device 20 and the transparent substrate 10 on the print board 30 at once, man-hours can further be reduced.

As discussed, the solid-state image pickup apparatus of the present invention may have an arrangement which includes: a transparent substrate including an inner wiring metal layer which is formed of an insulating thin film and a conductive thin film stacked, and an electrode terminal group formed externally so as to output an electric signal to the outside; and a solid-state image pickup device having each first projecting electrode which corresponds to the inner wiring metal layer of the transparent substrate formed on each surface electrode, the transparent substrate and the solid-state image pickup device being bonded by face-down packaging, wherein: the inner wiring metal layer of the transparent substrate and each the first projecting electrode of the solid-state image pickup device are connected by ultrasonic bonding, second projecting electrodes are respectively formed on electrode terminals of the electrode terminal group on the transparent substrate, while a print board having an aperture which is as large as the solid-state image pickup device, and a non-pin type lead terminal structure is bonded to the transparent substrate by obtaining an electric connection with respect to each the second projecting electrode of the transparent substrate and by hermetically sealing a light receiving surface of the solid-state image pickup device with a thermosetting resin.

Further, the solid-state image pickup apparatus of the present invention, in the foregoing solid-state image pickup apparatus, may have an arrangement in which fillets made of thermosetting resin are respectively formed between the print board and the solid-state image pickup device, and between the print board and the transparent substrate.

With the foregoing arrangement, the fillets made of thermosetting resin are respectively formed between the print board and the solid-state image pickup device, and between the print board and the transparent substrate.

Therefore, the fillets made of thermosetting resin can respectively fortify a space between the print board and the solid-state image pickup device, and a space between the print board and the transparent substrate, thereby increasing connection strength between the solid-state image pickup device and the transparent substrate.

As a result, bonding quality can be improved, thereby improving the quality of the solid-state image pickup apparatus.

Further, the solid-state image pickup apparatus of the present invention, in the foregoing solid-state image pickup apparatus, may have an arrangement in which the transparent substrate is made up of either glass or an optical filter.

With the foregoing arrangement, the transparent substrate is made up of either the glass or the optical filter.

Therefore, by adopting glass which is commonly used as a substrate, the substrate can be formed at a low cost. On the other hand, when adopting the optical filter, for example, the substrate which is suitable for receiving the image light of a camera and the like can be formed.

Further, the manufacturing method of the solid-state image pickup apparatus of the present invention may have an arrangement including the steps of: forming each first projecting electrode on each surface electrode of a solid-state image pickup device, forming a second projecting electrode in an electrode terminal group for outputting an electric signal to the outside on a transparent substrate having an inner wiring metal layer which is formed of an insulating thin film and a conductive thin film stacked, and the electrode terminal group formed on the outside, performing face-down packaging by arranging a surface of the transparent substrate with the inner wiring metal layer to face a surface of the solid-state image pickup device with the surface electrode, connecting each the first projecting electrode of the solid-state image pickup device and the inner wiring metal layer of the transparent substrate by ultrasonic bonding, applying a thermosetting resin in peripheries of each the second projecting electrode on the transparent substrate and of the solid-state image pickup device, fixing by pressing a print board having an aperture which is as large as the solid-state image pickup device and a non-pin type lead terminal structure against the transparent substrate and connecting each the second projecting electrode of the transparent substrate and a non-pin type lead terminal of the print board, and simultaneously, hermetically sealing a surface portion of the solid-state image pickup device with the thermosetting resin, and setting the thermosetting resin by applying heat.

Further, the manufacturing method of the solid-state image pickup apparatus of the present invention may have an arrangement in which as the thermosetting resin is used a thermosetting resin made of anisotropic conductive paste including conductive particles which are dispersed in a resin.

With the foregoing invention, as the thermosetting resin is used the thermosetting resin made of anisotropic conductive paste including the conductive particles which are dispersed in the resin.

Namely, when adopting the thermosetting resin made of anisotropic conductive paste including the conductive particles dispersed in the resin, in the case of joining the second projecting electrodes which are formed in the electrode terminal group of the transparent substrate and the non-pin type lead terminals of the print board, first, in the joint direction, they are joined so as to sandwich the conductive particles in the resin, thereby obtaining the electric connection. On the other hand, on a surface vertically intersecting in the joint direction, the conductive particles are dispersed in the resin, thus failing to obtain the electric connection.

As a result, when using the thermosetting resin made of anisotropic conductive paste including the conductive particles which are dispersed in the resin, the thermosetting resin can be applied over the entire surface including all the second projecting electrodes formed in the electrode terminal group on the transparent substrate. Namely, this does not cause a short-circuit defect to occur among the second projecting electrodes.

As a result, the thermosetting resin can be applied more easily and in a shorter period of time than applying it by dotting. In addition, this makes it possible to simultaneously apply a resin to hermetically seal the light receiving portions of the solid-state image pickup device.

Consequently, man-hours can surely be reduced.

Further, the manufacturing method of the solid-state image pickup apparatus of the present invention, in the foregoing manufacturing method of the solid-state image pickup apparatus, may have an arrangement in which the print board having the non-pin type lead terminal structure in the lattice. frame in which a plurality of non-pin type lead terminals are disposed in matrix is formed, then, the solid-state image pickup devices are respectively inserted into the frame apertures of the print board which is made up of the lattice frame, and the print board and the transparent substrate are bonded, and thereafter, the print board made up of the lattice frame is cut up by dicing for each of the solid-state image pickup devices.

With the foregoing invention, the print board having the non-pin type lead terminal structure in the lattice frame in which a plurality of non-pin type lead terminals are disposed in matrix is formed. Then, the solid-state image pickup devices are respectively inserted into the frame apertures of the print board which is made up of the lattice frame, and the print board and the transparent substrate are bonded, and thereafter, the print board made up of the lattice frame is cut up by dicing for each of the solid-state image pickup devices.

As a result, a plurality of the solid-state image pickup apparatuses can efficiently be formed.

Further, the solid-state image pickup apparatus of the present invention may have an arrangement which includes: a solid-state image pickup device having a plurality of surface electrodes which are formed on a light receiving surface side and first projecting electrodes which are respectively formed on the plurality of surface electrodes; a transparent substrate including a plurality of metal layers to be connected with the first projecting electrodes by ultrasonic bonding on a side of a surface facing the light receiving surface, and second projecting electrodes to be electrically connected with the metal layer; a print board including a frame aperture into which the solid-state image pickup device is inserted, and non-pin type lead terminals for electrically connecting the second projecting electrodes and an external device; and a seal resin for hermetically sealing the light receiving surface of the solid-state image pickup device, while sealing a space between the print board and the transparent substrate. In addition, the seal resin may be composed of a thermoplastic resin.

Further, it may be arranged that the seal resin is made up of anisotropic conductive paste including the conductive particles dispersed in the resin, and the second projecting electrode and the non-pin type lead terminal are electrically connected via the anisotropic conductive paste.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A solid-state image pickup apparatus, comprising:
   a transparent substrate having an inner wiring metal layer and an electrode terminal group for outputting an electric signal to the outside;
   a solid-state image pickup device in which each first projecting electrode corresponding to said inner wiring metal layer of said transparent substrate is formed on each surface electrode; and
   a print board of non-pin type lead terminal structure including an aperture which is as large as said solid-state image pickup device,
   wherein:
      said transparent substrate includes second projecting electrodes which are respectively formed on electrode terminals of said electrode terminal group,
      said transparent substrate and said solid-state image pickup device are bonded by face-down packaging, and said inner wiring metal layer of the transparent substrate and said each first projecting electrode of the solid-state image pickup device are connected by ultrasonic bonding, and
      said transparent substrate and said print board are electrically connected at said each second projecting electrode of the transparent substrate, and joined so that a light receiving portion of said solid-state image pickup device is hermetically sealed with a thermosetting resin.

2. The solid-state image pickup apparatus as set forth in claim 1, wherein an insulating thin film and a conductive thin film are stacked so as to form the inner wiring metal layer of said transparent electrode.

3. The solid-state image pickup apparatus as set forth in claim 1, wherein fillets made of thermosetting resin are formed between said print board and said solid-state image pickup device, and between said print board and said transparent substrate, respectively.

4. The solid-state image pickup apparatus as set forth in claim 1, wherein said transparent substrate is made of glass.

5. The solid-state image pickup apparatus as set forth in claim 1, wherein said transparent substrate is made up of an optical filter.

6. The solid-state image pickup apparatus as set forth in claim 1, wherein said thermosetting resin is an anisotropic conductive paste including conductive particles which are dispersed in a resin.

7. A solid-state image pickup apparatus, comprising:
   a solid-state image pickup device including a plurality of surface electrodes which are formed on a light receiving surface side and first projecting electrodes which are respectively formed on the plurality of surface electrodes;
   a transparent substrate including a plurality of metal layers to be connected with said first projecting electrodes by ultrasonic bonding on a side of a surface facing said light receiving surface, and second projecting electrodes to be electrically connected with said metal layer;

a print board including a frame aperture into which said solid-state image pickup device is inserted, and non-pin type lead terminals for electrically connecting said second projecting electrodes and an external device; and a seal resin for hermetically sealing said light receiving surface of the solid-state image pickup device, while sealing a space between said print board and said transparent substrate.

8. The solid-state image pickup apparatus as set forth in claim 7, wherein said seal resin is made of thermoplastic resin.

9. The solid-state image pickup apparatus as set forth in claim 7, wherein:

said seal resin is made of anisotropic conductive paste including conductive particles which are dispersed in a resin, and said second projecting electrodes and said non-pin type lead terminals are electrically connected via said anisotropic conductive paste.

* * * * *